(12) United States Patent
Maki

(10) Patent No.: US 6,541,980 B2
(45) Date of Patent: Apr. 1, 2003

(54) MULTIPLEX VOLTAGE MEASUREMENT APPARATUS

(75) Inventor: Ichiro Maki, Kanagawa (JP)

(73) Assignees: Matsushita Electric Industrial Co., Ltd., Osaka (JP); Toyota Jidosha Kabushiki Kaisha, Aichi (JP)

( * ) Notice: Subject to any disclaimer, the term of this patent is extended or adjusted under 35 U.S.C. 154(b) by 0 days.

(21) Appl. No.: 09/829,732

(22) Filed: Apr. 10, 2001

(65) Prior Publication Data

US 2001/0035765 A1 Nov. 1, 2001

(30) Foreign Application Priority Data

Apr. 10, 2000 (JP) ........................................ 2000-108671

(51) Int. Cl.⁷ ............................................ G01N 27/416
(52) U.S. Cl. ........................................ 324/426; 340/661
(58) Field of Search ................................. 324/428, 433, 324/434, 435, 663, 426, 429, 149, 140 R; 320/116, 120, 136; 340/636, 661

(56) References Cited

U.S. PATENT DOCUMENTS

| | | | | |
|---|---|---|---|---|
| 4,679,000 A | * | 7/1987 | Clark | 324/428 |
| 5,600,247 A | * | 2/1997 | Matthews | 324/426 |
| 5,712,568 A | | 1/1998 | Flohr et al. | |
| 5,760,587 A | * | 6/1998 | Harvey | 324/434 |
| 5,808,469 A | * | 9/1998 | Kopera | 324/434 |
| 5,811,976 A | * | 9/1998 | Fischer | 324/434 |
| 5,914,606 A | | 6/1999 | Becker-Irvin | |
| 6,094,053 A | * | 7/2000 | Harvey | 324/434 |
| 6,118,384 A | * | 9/2000 | Sheldon et al. | 340/636 |
| 6,362,626 B2 | * | 3/2002 | Furukawa | 324/429 |

FOREIGN PATENT DOCUMENTS

JP 08-140204 5/1996

OTHER PUBLICATIONS

European Search Report, dated Aug. 2, 2001.

* cited by examiner

*Primary Examiner*—N. Le
*Assistant Examiner*—Etienne P LeRoux
(74) *Attorney, Agent, or Firm*—Snell & Wilmer, LLP

(57) ABSTRACT

A multiplex voltage measurement apparatus configured to detect the breakage of a line coupling a voltage detection terminal and an electric leakage detection circuit includes a multiplex voltage measurement section and an electric leakage detection circuit. The multiplex voltage measurement section is configured to measure the voltage of each of N serially connected voltage sources via (N+1) voltage detection terminals coupled to a capacitor. The electric leakage detection circuit is configured to measure an insulation impedance between the voltage sources and a chassis. A sample switch in the leakage detection circuit prevents the formation of a loop connecting the electric leakage detection circuit to the voltage measurement section in the event of a disconnection between a voltage detection terminal and the multiplex voltage measurement section, allowing the detection of such a disconnection.

5 Claims, 5 Drawing Sheets

_US 6,541,980 B2_

MULTIPLEX VOLTAGE MEASUREMENT APPARATUS

BACKGROUND OF THE INVENTION

1. Field of the Invention

The present invention relates to a multiplex voltage measurement apparatus, and specifically to a multiplex voltage measurement apparatus for measuring a voltage of each of serially connected N voltage sources.

2. Description of the Related Art

A high-power electric source of several hundred voltages for an electric vehicle is formed by a number of secondary battery cells, such as nickel-hydrogen storage cells, which are serially connected to each other. Each of the serially connected battery cells should be monitored for its capacity for the purpose of charge/discharge control. In particular, a battery formed by 240 serially connected cells produces a total voltage of 288 V. In such a battery, it is physically difficult to monitor each cell. In Japanese Laid-Open Publication No. 8-140204, for example, the voltage is measured for each of 24 modules each including 10 cells.

In an electric vehicle, high-voltage systems are electrically insulated from a chassis in order to avoid hazardous conditions. On the other hand, since a processor for charge/discharge control uses a potential of the chassis as a reference potential, the voltage of a battery should be insulatively measured. In the battery disclosed in Japanese Laid-Open Publication No. 8-140204, an insulation circuit unit including an operational amplifier, an AD converter, a photocoupler, a power supply, etc., is provided for each module. The structure of such a battery is enormously complicated.

As means of insulatively measuring the output voltage of a sensor or the like, a flying capacitor is known. FIG. 3 shows a structure of a multiplex voltage measurement apparatus 400. In this example, the number of voltage sources (N) is 5.

Serially-connected voltage sources V1–V5 are connected to a capacitor 3 through voltage detection terminals T1–T6, and through a first multiplexer 1 formed by switches S1, S3, and S5 and a second multiplexer 2 formed by switches S2, S4, and S6. The capacitor 3 is connected to a voltage measurement circuit 6 through a first sample switch 4 formed by switches 4a and 4b and a polarity correction circuit 5.

FIG. 4 is a timing chart for opening/closure of the respective switches S1–S6, and 4a and 4b. An operation of the multiplex voltage measurement apparatus 400 is now described with reference to FIG. 4 in conjunction with FIG. 3.

Prior to measuring the voltages of the voltage sources V1–V5, the switches S1–S6, and 4a and 4b are all opened (OFF). During period P1, first of all. the switches S1 and S2 are closed (ON), whereby the voltage of the voltage source V1 is applied to the capacitor 3, and a charge is stored in the capacitor 3. After being kept closed (ON) for a predetermined time period, the switches S1 and S2 are turned off. Then, after a predetermined time has elapsed since the switches S1 and S2 were turned off, the first sample switch 4 (switches 4a and 4b) is turned on, whereby the charged voltage in the capacitor 3, i.e., the voltage of the voltage source V1, is transferred to the polarity correction circuit 5 and the voltage measurement circuit 6.

As a matter of course, a driving circuit of each switch and a contact point of the switch are kept separated. The first multiplexer 1 is not closed while the first sample switch 4 is closed, and the second multiplexer 2 is not closed while the first sample switch 4 is closed. Therefore, the voltage of the voltage source V1 is insulatively measured, i.e., when the voltage of the voltage source V1 is measured, the voltage source V1 and the capacitor 3 are insulated.

During period P2, the switches S2 and S3 and the switches 4a and 4b are similarly turned on and off, and. during period P3, the switches S3 and S4 and the switches 4a and 4b are similarly turned on and off. In this way, as shown in FIG. 4, the multiplex voltage measurement apparatus 400 operates in a multiplex manner.

It should be noted in FIG. 3 that the voltage value of an odd-numbered voltage source is inverted by the polarity correction circuit 5 so as to have the same polarity as that of the voltage value of an even-numbered voltage source before it is transmitted to the voltage measurement circuit 6. An example of the polarity correction circuit 5 is shown in FIG. 5.

The polarity correction circuit 5 shown in FIG. 5 is a well-known absolute-value circuit. The polarity correction circuit 5 changes the polarity of a voltage to be input to an AD converter of the voltage measurement circuit 6 such that all of the voltages to be input to the AD converter have the same polarity. The polarity correction circuit 5 is effective for a unipolar voltage source such as a battery. It should be noted that the polarity correction circuit 5 is not limited to such an analog circuit, but may be a digital circuit which is independent of a polarity output bit of a bipolar input-type AD converter.

Referring again to FIG. 3, the multiplex voltage measurement apparatus 400 further includes an electric leakage detection circuit 7. The electric leakage detection circuit 7 includes a second capacitor 10, amplifiers 11 and 12, a signal generation circuit 13, and a level comparison circuit 14. The electric leakage detection circuit 7 compares output levels of the amplifier 12 and the signal generation circuit 13, thereby measuring the insulation impedance between the N voltage sources and the chassis.

However, in the conventional multiplex voltage measurement apparatus 400 having the above-described structure, if a line between the voltage detection terminal T6 and the switch S6 which is connected to the electric leakage detection circuit 7 is disconnected at position 15 (shown by "x" in FIG. 6), a loop L (represented by a line with arrows in FIG. 6) is formed. As a result, an electric charge is stored in the first capacitor 3, which should not be generated when the switches S1–S6 are open, and accordingly, a voltage is generated therein. Therefore, breakage of the line connected to the voltage detection terminal T6, e.g., disconnection at position.15, cannot be detected.

SUMMARY OF THE INVENTION

According to one aspect of the present invention, a multiplex voltage measurement apparatus includes a multiplex voltage measurement section for measuring a voltage of each of N serially connected voltage sources and an electric leakage detection circuit for measuring an insulation impedance between the N voltage sources and a chassis, the multiplex voltage measurement section including, (N+1) voltage detection terminals connected to the N voltage sources, a first capacitor having a first terminal and a second terminal, a first multiplexer for selectively connecting any of odd-numbered voltage detection terminals among the (N+1) voltage detection terminals to the first terminal of the first capacitor, a second multiplexer for selectively connecting any of even-numbered voltage detection terminals among the (N+1) voltage detection terminals to the second terminal of the first capacitor, a voltage measurement circuit for measuring the voltage between the first terminal and the second terminal of the first capacitor, a first sample switch for connecting the first terminal and the second terminal of the first capacitor to the voltage measurement circuit, and a polarity correction circuit for changing the polarity of voltages of the N voltage sources such that the voltages of the odd-numbered voltage sources among the N voltage sources and the voltages of the even-numbered voltage sources among the N voltage sources have the same polarity, wherein the multiplex voltage measurement section measures the voltages of the N voltage sources by repeating a process in which the first and second multiplexers select one of the N voltage sources, and the first and second multiplexers are opened while the first sample switch is closed, and the electric leakage detection circuit including a second capacitor connected to one end of the N voltage sources, a signal generator for supplying a signal through the second capacitor to the one end of the N voltage sources, a level comparison circuit for comparing a signal level of the signal generator and a signal level of the second capacitor, and a second sample switch provided between the signal generator and the one end of the N voltage sources.

In one embodiment of the present invention, the second sample switch is provided between the second capacitor and the one end of each of the N voltage sources.

In another embodiment of the present invention, the second sample switch is provided between the second capacitor and the signal generator.

In still another embodiment of the present invention, the second sample switch is opened only when the multiplex voltage measurement circuit measures one of the N voltage sources which is located at the one end of the N voltage sources.

According to the present invention, in order to eliminate the above-described problem in the conventional voltage measurement apparatus, a second sample switch is provided for opening/closing a line between the signal generator 13 of the electric leakage detection circuit 7 and one end of the N voltage sources in the conventional multiplex voltage measurement apparatus 400 shown in FIG. 6.

The second sample switch is opened only when measuring one of the N voltage sources which is located at the one end of the N voltage sources. Otherwise, the second sample switch is closed.

With such an arrangement, even when the line between the voltage detection terminal T6 and the switch S6 is disconnected, the loop L described above is not formed, and an electric charge is not stored in the first capacitor 3. Therefore, the disconnection of the line between the voltage detection terminal T6 and the switch S6 can be easily detected. It should be noted that the voltage sources except for the first and last voltage sources of the serially connected N voltage sources are not connected to the electric leakage detection circuit, and thus, the loop L is not formed with respect to these voltage sources.

Furthermore, the second sample switch may be provided between the second capacitor 10 and one end of the N voltage sources, or between the second capacitor 10 and the signal generator 13. In either case, the same effects can be obtained.

Thus, the invention described herein makes possible the advantage of providing a multiplex voltage measurement apparatus which can detect breakage of a line which is provided between a voltage detection terminal and a switch corresponding thereto and which is connected to an electric leakage detection circuit.

This and other advantages of the present invention will become apparent to those skilled in the art upon reading and understanding the following detailed description with reference to the accompanying figures.

DESCRIPTION OF THE PREFERRED EMBODIMENTS

Hereinafter, embodiments of the present invention will be described with reference to FIGS. 1 and 2.
(Embodiment 1)

Figure 3:
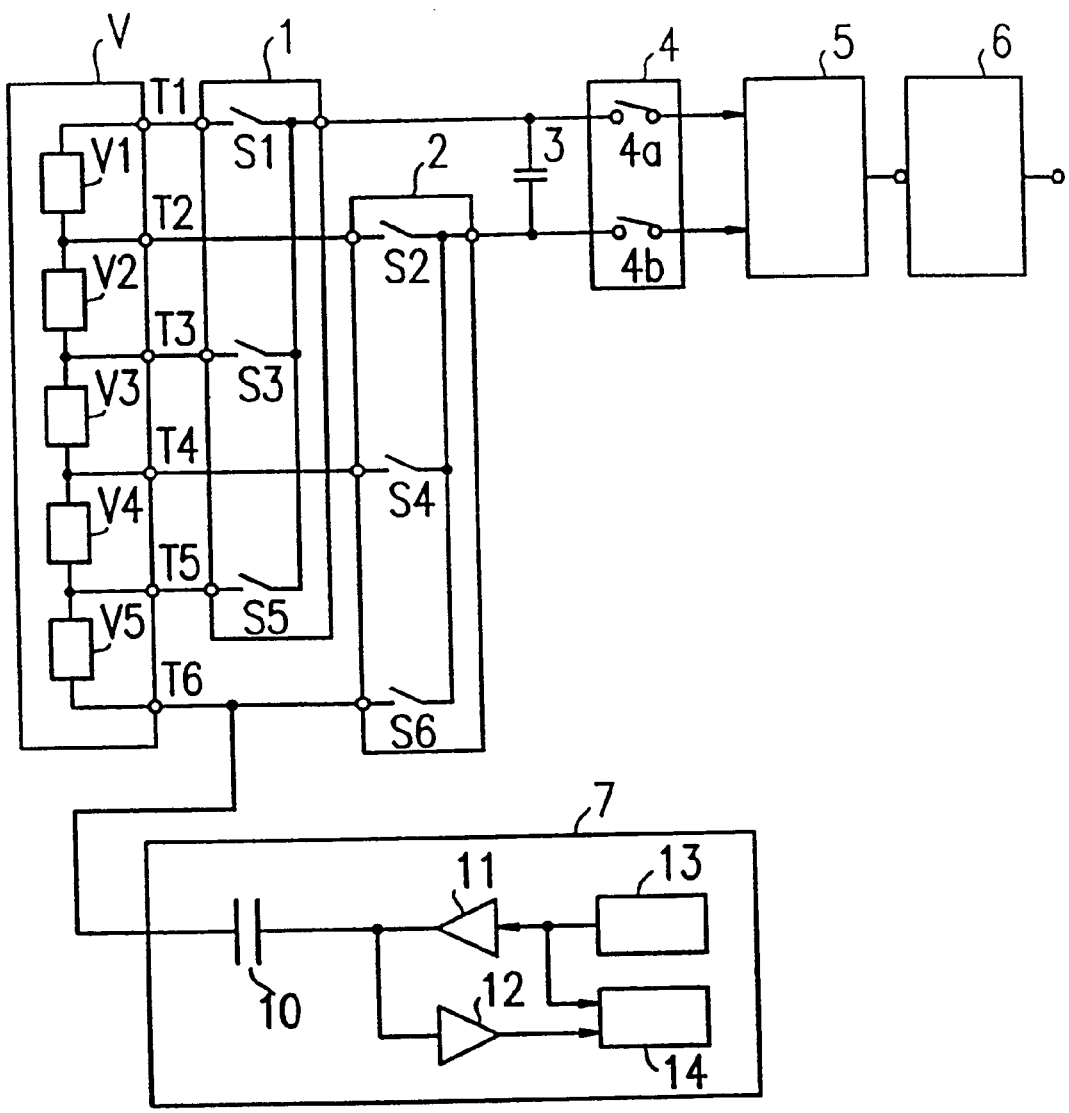
FIG. 3 shows a structure of a conventional multiplex voltage measurement apparatus 400.

A multiplex voltage measurement apparatus 100 according to embodiment 1 of the present invention is described with reference to FIG. 1. In FIG. 1, like elements are indicated by like reference numerals used to describe the multiplex voltage measurement apparatus 400 of FIG. 3, and detailed descriptions thereof are omitted. Reference numeral 8 denotes a leakage resistance between a chassis (not shown) and a battery.

The multiplex voltage measurement apparatus 100 includes a multiplex voltage measurement section 200 for measuring the voltage of each of five serially-connected voltage sources V1–V5, and an electric leakage detection circuit 300 for measuring the insulation impedance between the five voltage sources and the chassis.

The multiplex voltage measurement section 200 includes: six voltage detection terminals T1–T6 connected to the five voltage sources V1–V5; a first capacitor 3 having a first terminal 3A and a second terminal 3B; a first multiplexer 1 formed by switches S1, S3, and S5 for selectively connecting any of the odd-numbered voltage detection terminals T1, T3, and T5 to the first terminal 3A of the capacitor 3; a second multiplexer 2 formed by switches S2, S4, and S6 for selectively connecting any of the even-numbered voltage detection terminals T2, T4, and T6 to the second terminal 3B of the capacitor 3; a polarity correction circuit 5 and a voltage measurement circuit 6 for measuring the voltage between the first terminal 3A and the second terminal 3B, and a first sample switch 4 formed by switches 4a and 4b for connecting the first terminal 3A and the second terminal 3B of the first capacitor 3 to the polarity correction circuit 5 and the voltage measurement circuit 6. The polarity correction circuit 5 changes the polarity of a voltage to be input to the voltage measurement circuit 6 such that the voltages derived from the odd-numbered voltage sources V1, V3, and V5 and the voltages derived from the even-numbered voltage sources V2, V4, and V6 have the same polarity.

In the multiplex voltage measurement section 200, the first multiplexer 1 and the second multiplexer 2 select one of the voltage sources V1–V5 while the first sample switch 4 is open. Then, the first multiplexer 1 and the second multiplexer 2 are opened, and the first sample switch 4 is then closed. Such a process is repeated, whereby the voltages of the respective voltage sources V1–V5 are measured.

Figure 4:
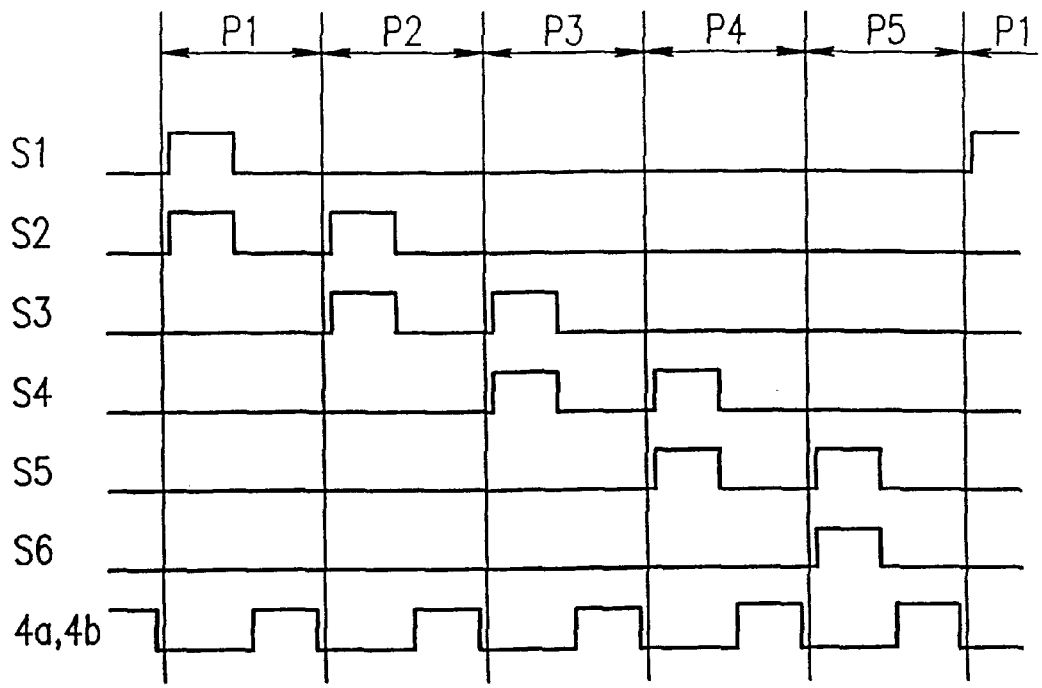
FIG. 4 is a timing chart for illustrating an operation of the conventional multiplex voltage measurement apparatus 400.
Figure 5:
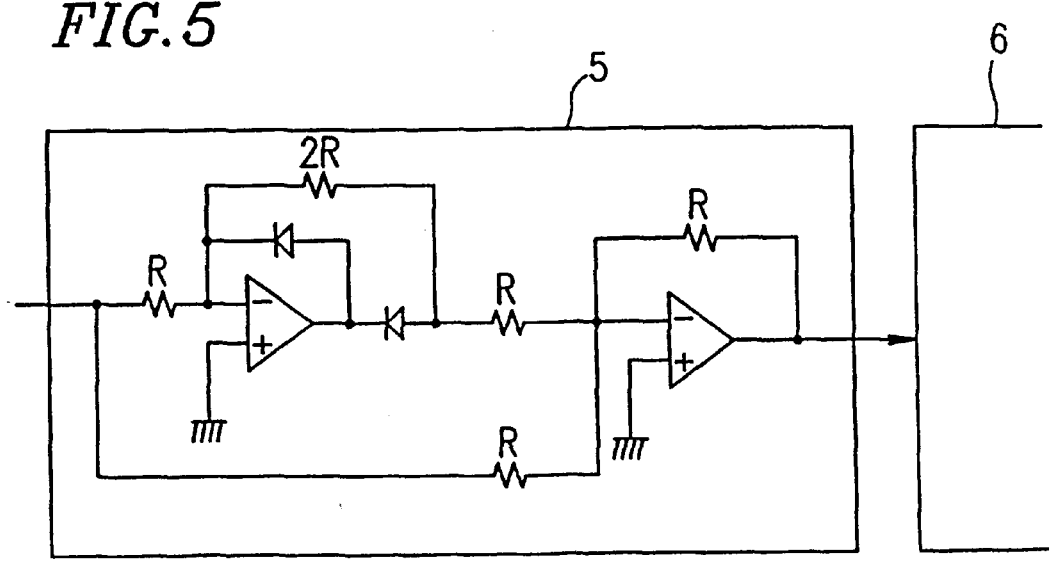
FIG. 5 shows a structure of a polarity correction circuit 5.

For example, in the case of measuring the voltage of the voltage source V1, the switches S1 and S2 are closed (ON) while the first sample switch 4 is open (OFF) (see period P1 in FIG. 4). Meanwhile, the switches S3, S4, S5, and S6 are open (OFF).

When the switches S1 and S2 are closed, the voltage of the voltage source V1 is applied to the capacitor 3, and an electric charge is stored in the capacitor 3. After being kept closed (ON) for a predetermined time period, the switches S1 and S2 are turned off. Then, after a predetermined time has elapsed since the switches S1 and S2 were turned off, the first sample switch 4 (switches 4a and 4b) is turned on, whereby the charged voltage in the capacitor 3, i.e., the voltage of the voltage source V1, is applied to the polarity correction circuit 5. The polarity correction circuit 5 generates based on the voltage of the voltage source V1 a signal which has the same polarity as that of the voltage of the voltage source V1, and transmits this signal to the voltage measurement circuit 6, which measures the voltage of the voltage source V1 based on the signal received from the polarity correction circuit 5. This process is repeatedly and sequentially performed for the voltage sources V1–V5, whereby the voltages of the voltage sources V1–V5 are measured.

The electric leakage detection circuit 300 includes: a second capacitor 10 connected to a line between the voltage source V5 and the voltage detection terminal T6: a signal generator 13 for supplying a signal to the voltage source V5 through the second capacitor 10; a level comparison circuit 14 for comparing signal levels of the second capacitor 10 and the signal generator 13; and a second sample switch 15a provided between the voltage source V5 and the second capacitor 10.

In this example, the multiplex voltage measurement section 200 includes five voltage sources V1–V5 and six voltage detectionterminals T1–T6, but the number of voltage sources and the number of voltage detection terminals are not limited thereto. The present invention can be practiced so long as N voltage sources and (N+1) voltage detection terminals are provided.

Figure 1:
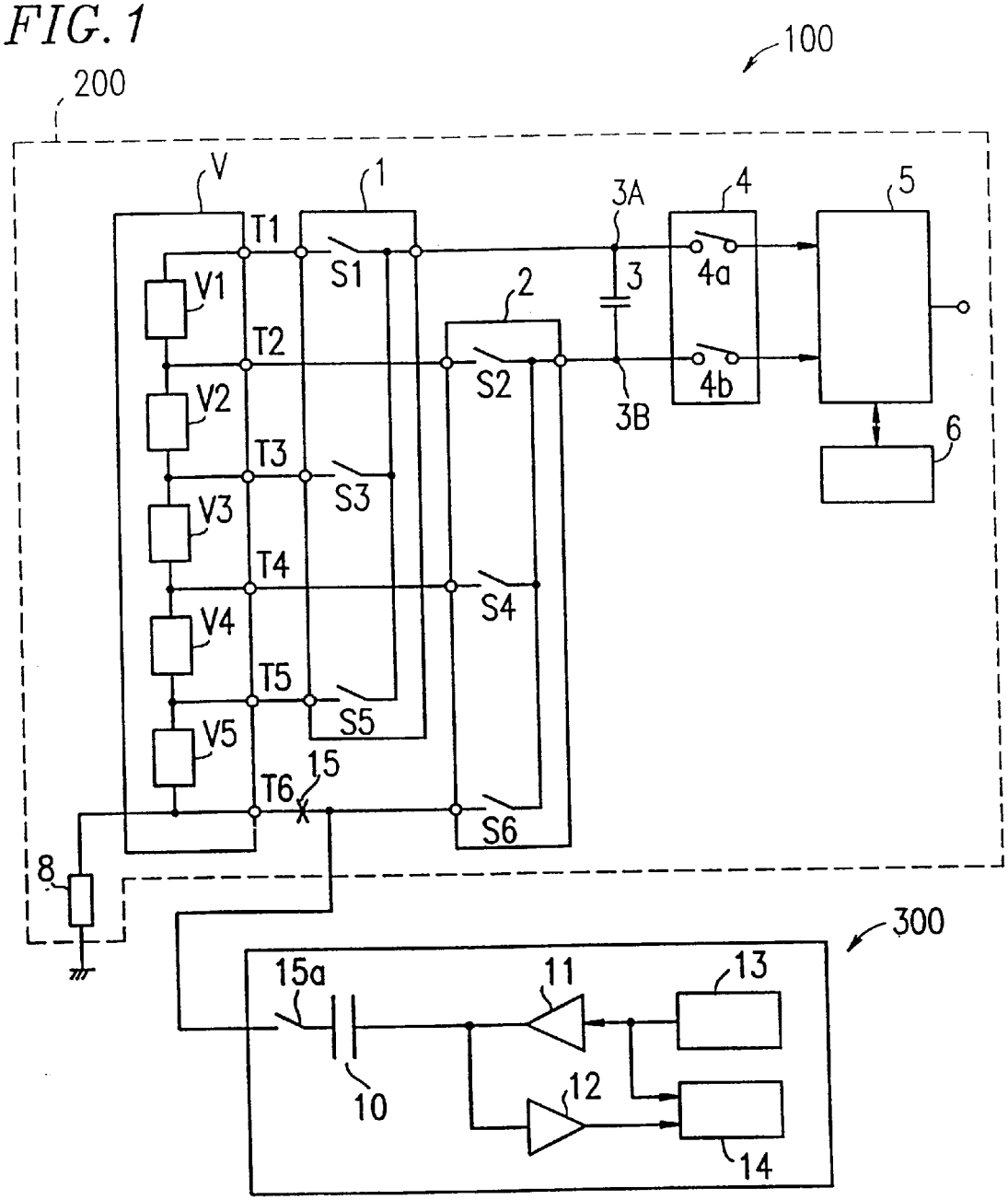
FIG. 1 shows a structure of a multiplex voltage measurement apparatus 100 according to embodiment 1 of the present invention.
Figure 2:
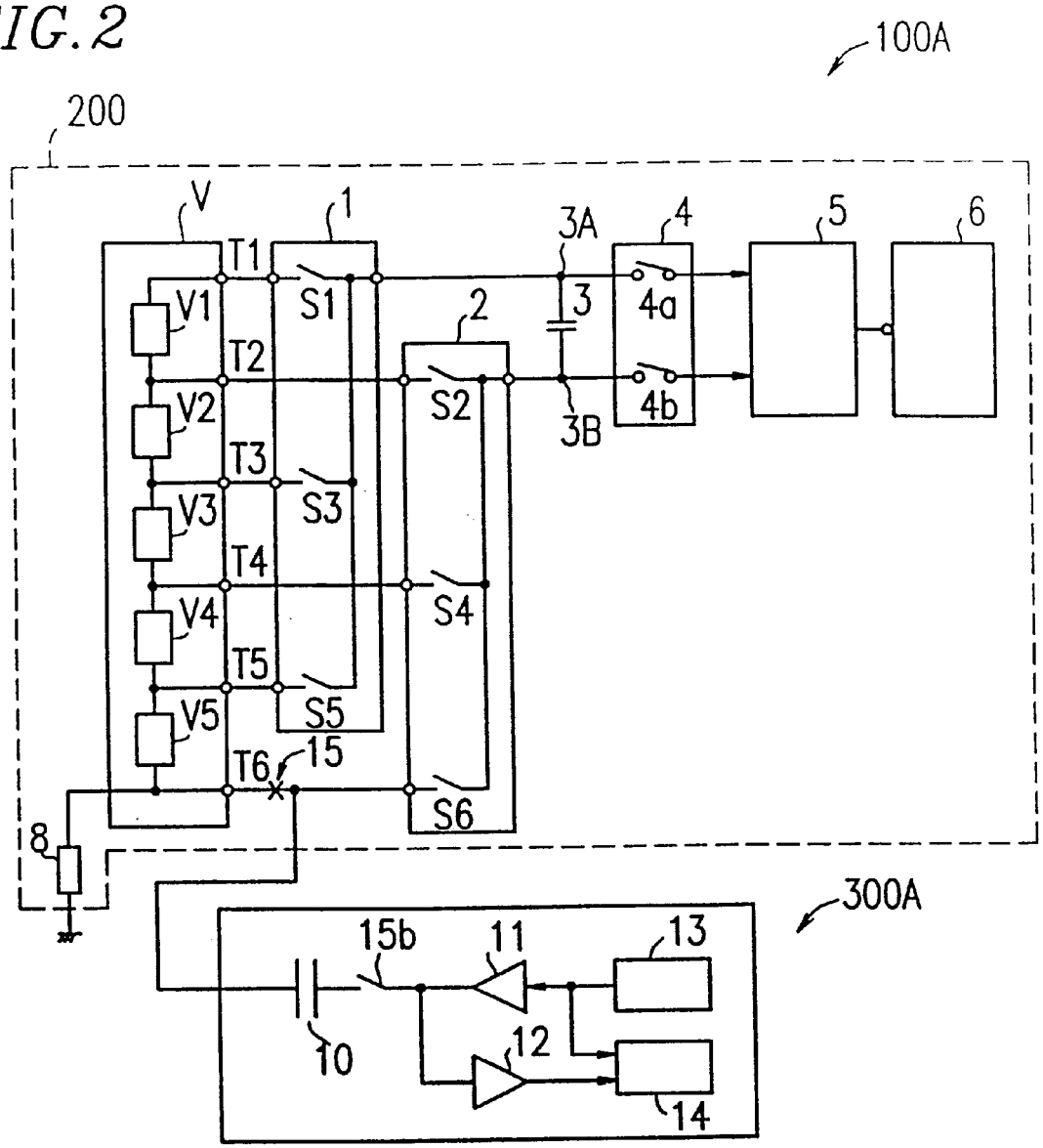
FIG. 2 shows a structure of a multiplex voltage measurement apparatus 100A according to embodiment 2 of the present invention.

In the multiplex voltage measurement apparatus 100 of FIG. 1, when the voltage of the voltage source V5 is measured while the second sample switch 15a of the electric leakage detection circuit 300 is open, the switches S5 and S6 are closed, whereby the capacitor 3 is charged with the voltage of the voltage source V5. Then, the switches S5 and S6 are opened, and the first sample switch 4 is closed, whereby the voltage of the voltage source V5 is measured by the voltage measurement circuit 6.

In the above structure, if a line between the voltage detection terminal T6 and the switch S6 is disconnected at position 15 (shown by "x" in FIG. 1), the capacitor 3 is not charged with the voltage of the voltage source V5. Accordingly, the voltage between the first terminal 3A and the second terminal 3B of the capacitor 3 decreases to 0 V. Therefore, the disconnection at position 15 can be detected.

Figure 6:
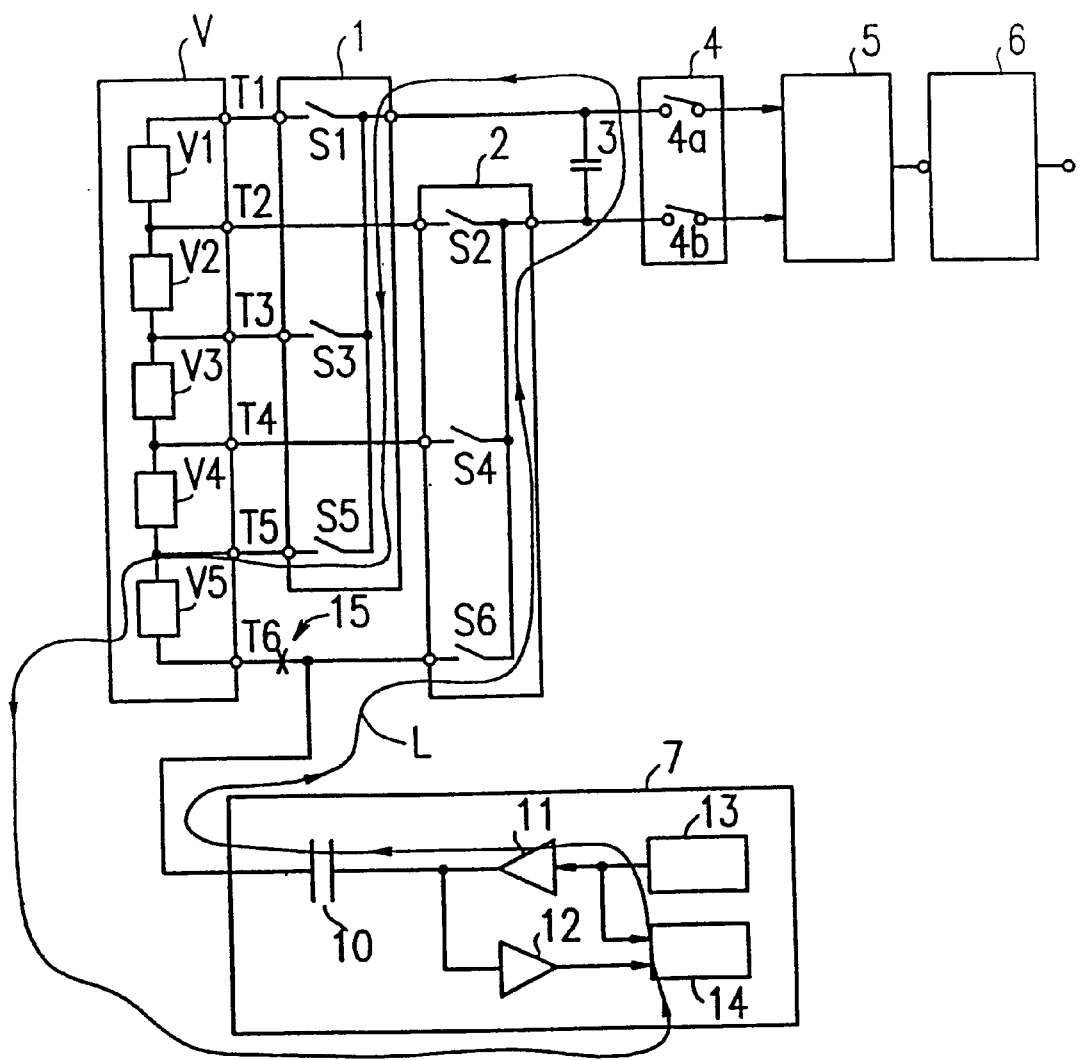
FIG. 6 illustrates an operation of the conventional multiplex voltage measurement apparatus 400 when a line breakage occurred.

However, if the second sample switch 15a is closed, an output of the electric leakage detection circuit 300 flows in the following order: the electric leakage detection circuit 300→the switch S6→the first capacitor 3→the voltage source V5→leakage resistance 8→the electric leakage detection circuit 300, whereby the same loop as the loop L of FIG. 6 is formed. In such a case, the voltage between the first terminal 3A and the second terminal 3B of the capacitor 3 does not decrease to a small value, such as 0 V. Accordingly, an incorrect value is measured as the voltage of the voltage source V5, and the disconnection at position 15 cannot be detected.

According to this embodiment, in order to avoid such a malfunction, the second sample switch 15a is opened simultaneously with the closure of the switches S5 and S6, whereby the above loop is not formed. With such an arrangement, when the line between the voltage detection terminal T6 and the switch S6 is disconnected at position 15, the voltage value between the first terminal 3A and the second terminal 3B of the capacitor 3 decreases to 0 V and, therefore, the disconnection of the line between the voltage detection terminal T6 and the switch S6 can be detected.

(Embodiment 2)

A multiplex voltage measurement apparatus 100A according to embodiment 2 of the present invention is described with reference to FIG. 2. In FIG. 2, like elements are indicated by like reference numerals used to describe the multiplex voltage measurement apparatus 100 of FIG. 1, and detailed descriptions thereof are omitted.

In the multiplex voltage measurement apparatus 100A according to embodiment 2 of the present invention, especially in the electric leakage detection circuit 300A, the second sample switch 15b is provided between the second capacitor 10 and the signal generator 13 in place of the second sample switch 15a provided between the voltage source V5 and the second capacitor 10. Effects obtained by this structure are completely the same as those obtained by the electric leakage detection circuit 300 of the multiplex voltage measurement apparatus 100 according to embodiment 1.

As described hereinabove, according to the present invention, there can be provided a multiplex voltage measurement apparatus which can detect breakage of a line which is provided between a voltage detection terminal and a switch corresponding thereto and which is connected to an electric leakage detection circuit.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A multiplex voltage measurement apparatus, comprising a multiplex voltage measurement section for measuring a voltage of each of N serially connected voltage sources and an electric leakage detection circuit for measuring an insulation impedance between the N voltage sources and a chassis, the multiplex voltage measurement section induding,
(N+1) voltage detection terminals connected to the N voltage sources,
a first capacitor having a first terminal and a second terminal,
a first multiplexer for selectively connecting any of odd-numbered voltage detection terminals among the (N+1) voltage detection terminals to the first terminal of the first capacitor,
a second multiplexer for selectively connecting any of even-numbered voltage detection terminals among the (N+1) voltage detection terminals to the second terminal of the first capactor, a voltage measurement circuit for measuring the voltage between the first terminal and the second terminal of the first capacitor, a first sample switch for connecting the first terminal and the second terminal of the first capacitor to the voltage measurement circuit, and a polarity correction circuit for changing the polarity of voltages of the N voltage sources such that the voltages of the odd-numbered voltage sources among the N voltage sources and the voltages of the even-numbered voltage sources among the N voltage sources have the same polarity, wherein the multiplex voltage measurement section measures the voltages of the N voltage sources by repeating a process in which the first and second multiplexers select one of the N voltage sources, and the first and second multiplexers are opened while the first sample switch is closed, and the electric leakage detection circuit including, a second capacitor connected to an end terminal of the (N+1) voltage detection terminals, a signal generator for supplying a signal through the second capacitor to the end terminal of the (N+1) voltage detection terminals, a level comparison circuit for comparing a signal level of the signal generator and a signal level of the second capacitor, and a second sample switch provided between the signal generator and the end terminal of the (N+1) voltage detection terminals.

2. A multiplex voltage measurement apparatus according to claim 1, wherein the second sample switch is provided between the second capacitor and the end terminal of the (N+1) voltage detection terminals.

3. A multiplex voltage measurement apparatus according to claim 1, wherein the second sample switch is provided between the second capacitor and the signal generator.

4. A multiplex voltage measurement apparatus according to claim 1, wherein the second sample switch is opened only when the multiplex voltage measurement circuit measures one of the N voltage sources which is located at the end terminal of the (N+1) voltage detection terminals.

5. A multiplex voltage measurement apparatus, comprising a multiplex voltage measurement section for measuring a voltage of each of N serially connected voltage sources and an electric leakage detection circuit for measuring an insulation impedance between the N voltage sources and a chassis, the multiplex voltage measurement section including, (N+1) voltage detection terminals connected to the N voltage sources, a first capacitor having a first terminal and a second terminal, a first multiplexer for selectively connecting any of odd-numbered voltage detection terminals among the (N+1) voltage detection terminals to the first terminal of the first capacitor, a second multiplexer for selectively connecting any of even-numbered voltage detection terminals among the (N+1) voltage detection terminals to the second terminal of the first capacitor, a voltage measurement circuit for measuring the voltage between the first terminal and the second terminal of the first capacitor, a first sample switch for connecting the first terminal and the second terminal of the first capacitor to the voltage measurement circuit, and a polarity correction circuit for changing the polarity of voltages of the N voltage sources such that the voltages of the odd-numbered voltage sources among the N voltage sources and the voltages of the even-numbered voltage sources among the N voltage sources have the same polarity, wherein the multiplex voltage measurement section measures the voltages of the N voltage sources by repeating a process in which the first and second multiplexers select one of the N voltage sources, and the first and second multiplexers are opened while the first sample switch is closed, and the electric leakage detection circuit including, a second capacitor connected to an end terminal of the (N+1) voltage detection terminals, a signal generator for supplying a signal through the second capacitor to the end terminal of the (N+1) voltage detection terminals, a level comparison circuit for comparing a signal level of the signal generator and a signal level of the second capacitor, and a second sample switch provided between the signal generator and the end terminal of the (N+1) voltage detection terminals, whereby an incorrect voltage is not measured by the voltage measurement circuit in the event of a disconnection in the multiplex voltage measurement circuit.

* * * * *